US006947864B2

(12) United States Patent
Garnett

(10) Patent No.: US 6,947,864 B2
(45) Date of Patent: *Sep. 20, 2005

(54) LATENT FAULT DETECTION IN REDUNDANT POWER SUPPLY SYSTEMS

(75) Inventor: Paul J. Garnett, Camberley (GB)

(73) Assignee: Sun Microsystems, Inc., Santa Clara, CA (US)

(*) Notice: Subject to any disclaimer, the term of this patent is extended or adjusted under 35 U.S.C. 154(b) by 74 days.

This patent is subject to a terminal disclaimer.

(21) Appl. No.: 10/455,754

(22) Filed: Jun. 4, 2003

(65) Prior Publication Data

US 2004/0039536 A1 Feb. 26, 2004

(30) Foreign Application Priority Data

Jun. 6, 2002 (GB) .............................................. 0212994

(51) Int. Cl.[7] .................................................. H02J 9/06
(52) U.S. Cl. ...................................... 702/118; 702/185
(58) Field of Search ............................. 324/158.1, 767, 324/537; 340/635, 645, 650, 652, 657, 660, 664, 514; 702/108, 117–119, 185

(56) References Cited

U.S. PATENT DOCUMENTS

| 3,679,970 | A | | 7/1972 | Winters et al. |
| 4,156,189 | A | * | 5/1979 | Genuit et al. ............... 324/771 |
| 5,072,175 | A | * | 12/1991 | Marek ........................ 324/73.1 |
| 5,325,062 | A | | 6/1994 | Bachand et al. |
| 5,519,335 | A | * | 5/1996 | Thomas ...................... 324/765 |
| 5,554,928 | A | * | 9/1996 | Stringer .................... 324/158.1 |
| 5,737,202 | A | | 4/1998 | Shimamori |
| 6,157,308 | A | | 12/2000 | Byers |
| 6,301,133 | B1 | | 10/2001 | Cuadra et al. |
| 6,661,119 | B2 | | 12/2003 | Liu et al. |

FOREIGN PATENT DOCUMENTS

EP 0690542 1/1996

* cited by examiner

Primary Examiner—Marc S. Hoff
Assistant Examiner—Craig Steven Miller
(74) Attorney, Agent, or Firm—Meyertons Hood Kivlin Kowert & Goetzel, P.C.; B. Noël Kivlin

(57) ABSTRACT

Latent faults are detected by a testing system in a redundant DC power supply system having at least two power supplies connected to a common load via respective isolation devices. The testing system selects as a subject for a test procedure one isolation device and its corresponding power supply. The power supplies are controlled during the test procedure to marginally vary the output voltage of at least one power supply such that a differential voltage is applied between the output of the selected power supply and the outputs of the remaining power supplies for selectively changing the conductive state of at least one isolation device to a non conductive state by reducing its forward voltage to less than its respective forward bias voltage value.

31 Claims, 4 Drawing Sheets

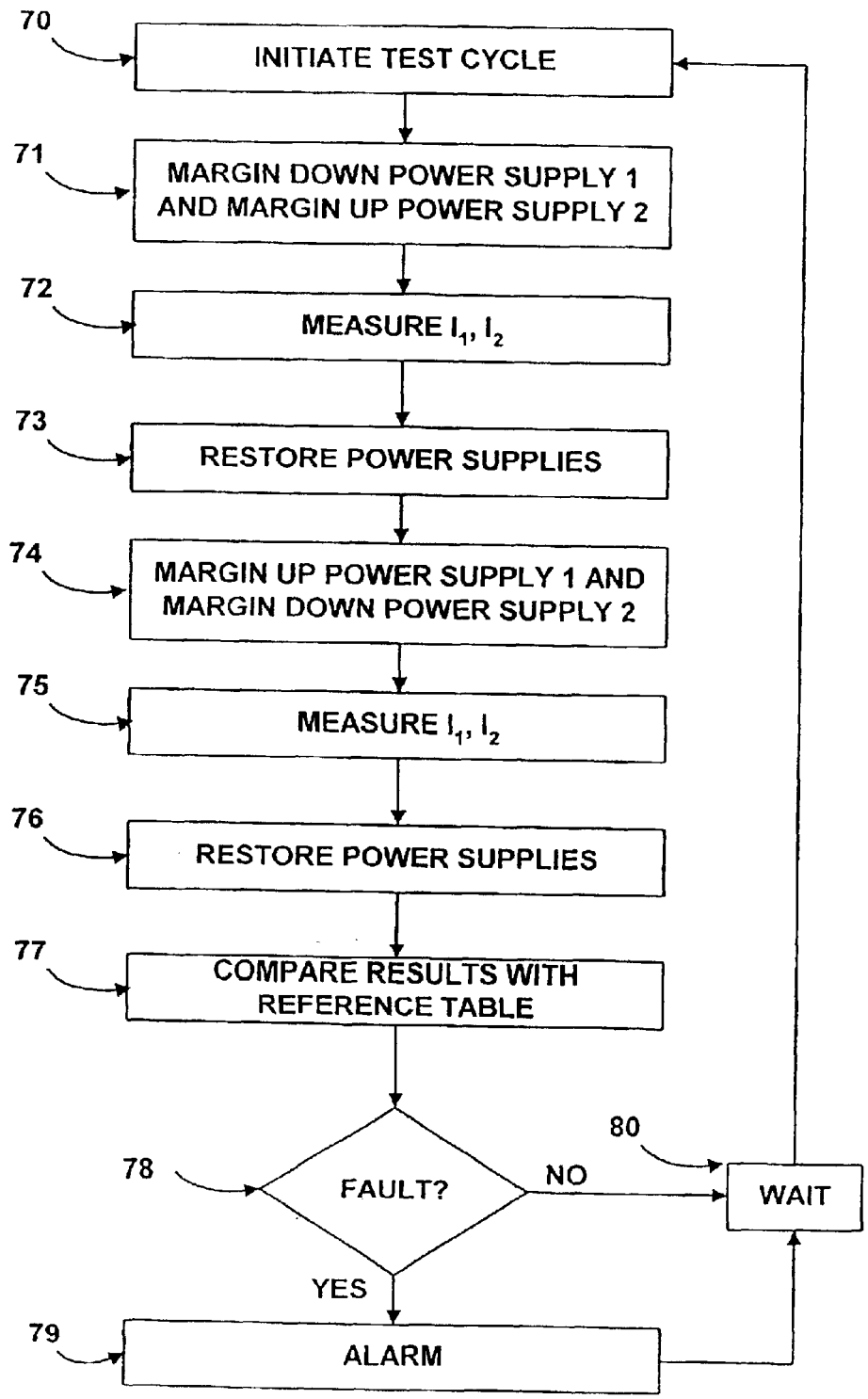

LATENT FAULT DETECTION IN REDUNDANT POWER SUPPLY SYSTEMS

BACKGROUND OF THE INVENTION

This invention relates to power supply systems in which a plurality of DC power supplies are arranged to supply a common load, at least one of the power supplies being redundant during normal operation such that the system is capable of continuing to supply the load in the event of failure of one of the power supplies.

It is customary for each power supply to be provided with a respective isolation device such as a diode to prevent any unwanted backflow of current under any circumstances where the power supply to which it is connected is inoperative, whether intentionally or due to malfunction.

A latent fault may exist if an isolation device fails, for example by developing a short circuit fault, there being apparently no overall change in the operational status of the system while its power supply continues to be operative. Since, however, the integrity of the isolation device is relied upon in the event of power supply failure, the existence of a latent fault can have serious repercussions. Such a fault may result in undesirable reverse current through a defective power supply if the protection provided by the isolation device is removed due to short circuit failure with the potential for causing a catastrophic failure of other power supplies of the system or causing damage to the load, as for example in the case where the system powers a computer system.

U.S. Pat. No. 5,548,463 discloses detection of a latent short circuit fault in a power mixing device by momentarily turning off power on a first rail and monitoring a test node on the first rail between the power supply and the power mixing device to detect a momentary return to ground at the test node. This sequence is then repeated for corresponding elements of a second rail. For many systems, however, such interruption of a power supply with its associated transients may be unacceptable.

SUMMARY OF THE INVENTION

Embodiments of the present invention seek to provide an improved method of latent fault detection and an improved power supply system having power supply redundancy.

A method according to one embodiment provides detection of a latent fault in a redundant DC power supply system having at least two power supplies connected to a common load via respective isolation devices. Each of the isolation devices is a semiconductor diode which requires a forward voltage across the diode to be equal to a characteristic bias voltage to allow operation in a normal conductive state. The method comprises controlling the power supplies to apply a test procedure to a selected isolation device such that the corresponding power supply output voltage is marginally varied relative to the output voltage of the remaining power supplies by a differential amount which is sufficient to change the conductive state of either the selected isolation device or of each of the remaining isolation devices, depending on the sense of the differential amount. If for example the differential amount reduces the actual forward voltage across the selected isolation device to be less than the bias voltage required to enable conduction, this should have the effect of turning off conduction in the selected isolation device. If the differential amount is applied in the opposite sense to reduce the actual forward voltage across each of the non-selected isolation devices, this should have the effect of turning off conduction in the non-selected isolation devices. An electrical current through the selected isolation device is in each case sensed. The test procedure is repeated for each remaining isolation device. The sensed signals from each of the test procedures are utilised by a detection circuit to determine whether the measured currents are consistent with correct operation of the isolation devices. If correct operation is not confirmed, a fault condition is detected.

In some embodiments, the differential voltage is created by marginally varying in one sense the power supply voltage of the power supply corresponding to the isolation device under test while marginally varying in the opposite sense the power supply voltage of each of the remaining power supplies by a corresponding amount. Minimal disturbance to the load voltage is thereby achieved, the amount of variation being selected to ensure that at all times, the load receives continuous supply at a voltage above a minimum required level.

BRIEF DESCRIPTION OF THE DRAWINGS

Embodiments of the invention will now be described by way of example only and with reference to the accompanying drawings of which:

FIG. 4 is a flow chart of a method of testing the system of FIGS. 2 and 3.

DETAILED DESCRIPTION OF EMBODIMENTS

Figure 1:
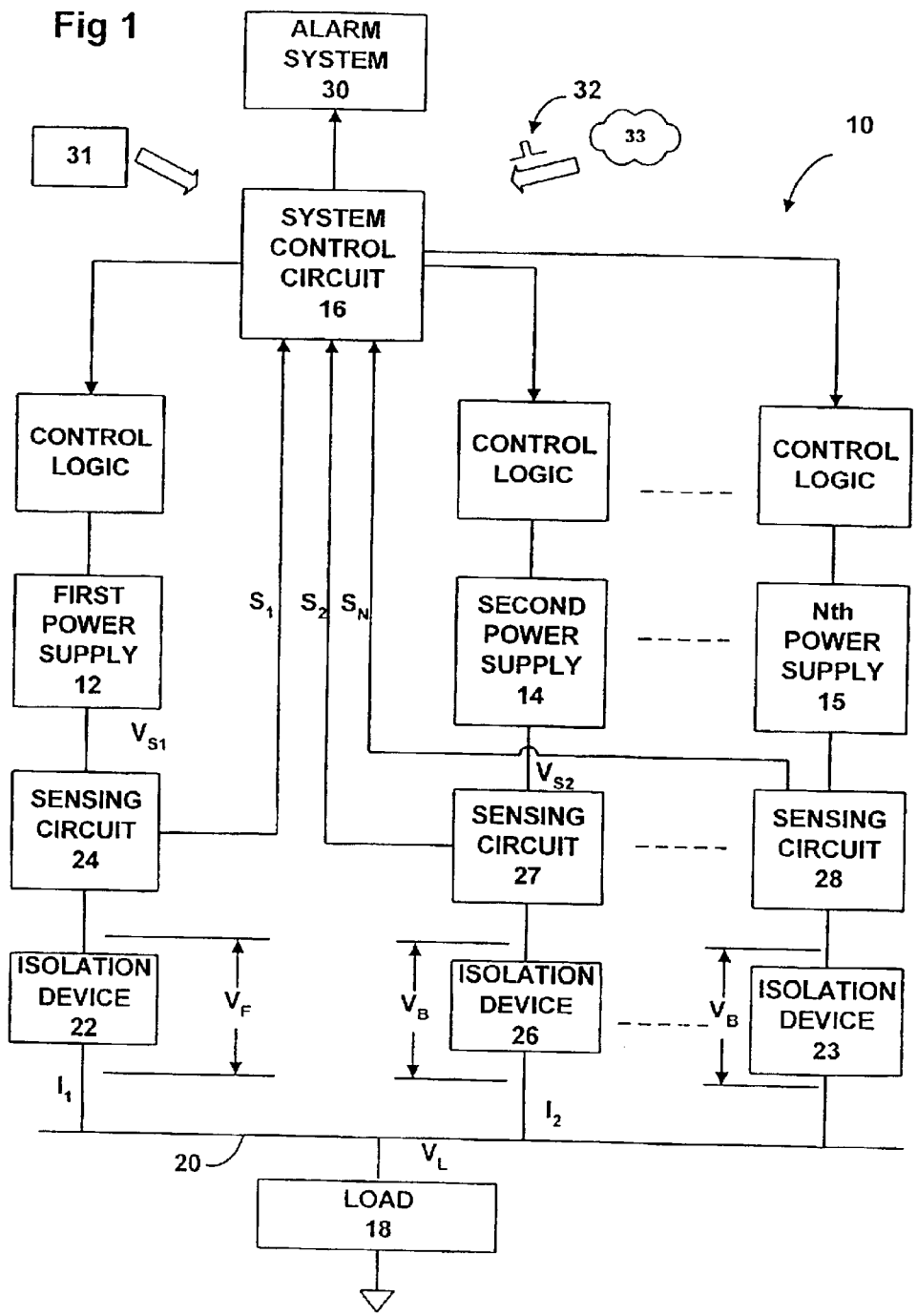
FIG. 1 is a schematic diagram of a power supply system having N power supplies during a short circuit detection test in which the output of a first power supply is reduced while increasing the output of each of the remaining power supplies.

FIG. 1 illustrates a power supply system 10 comprising a series of N power supplies of which a first power supply 12, a second power supply 14, and an Nth power supply 15 are shown, each power supply of the system being connected to a system control circuit 16.

The power supplies 12, 14, 15 are arranged in parallel to supply a load 18 with a load voltage $V_L$ via a power bus 20.

Each power supply 12, 14, 15 is provided with a respective isolation device so that, as shown in FIG. 1, a first isolation device 22 is connected in series with the first power supply 12 and is arranged to conduct current in only one direction, from the power supply to the power bus 20.

A first current sensing circuit 24 is connected in series with the first isolation device 22 to detect the magnitude and direction of current $I_1$ through the first isolation device.

Respective isolation devices and current sensing circuits are similarly connected for each of the remaining power supplies in the system 10, so that the second power supply 14 is provided with a second isolation device 26 connected in series with a second current sensing circuit 27, thereby providing one way conduction of current from the second power supply 14 to the power bus 20 and sensing of a current $I_2$ through the second isolation device. The Nth power supply 15 similarly is connected to the load 18 via a sensing circuit 28 and an isolation device 23.

Each of the sensing circuits 24, 27 and 28 is connected to the system control circuit 16 to provide signals $S_1$ to $S_N$ representative of the current through the respective isolation devices so that, as shown in FIG. 1, the first current sensing circuit 24 provides a sensor signal $S_1$, the second current sensing circuit 27 provides a sensor signal $S_2$ and the Nth current sensing circuit 28 provides a sensor signal $S_N$.

The system control circuit 16 is connected to an alarm system 30 for generating an alarm to indicate to a user the detection of a latent fault in one of the N isolation devices 22, 26, 23.

The system control circuit 16 controls performance of a test cycle in which one of the isolation devices in the system 10 is subject to a test procedure, a corresponding test procedure then being performed in respect of a next in turn isolating device until all isolation devices in the system have been checked. The test cycle is repeated at intervals. In the example of system 10, the load 18 to which the system supplies power is constituted by a computer system and the test cycle is repeated daily. Any faults are indicated by activating the alarm system 30 to alert the user to the need to perform maintenance. The system control circuit 16 is programmed to automatically initiate a test cycle at intervals determined in accordance with a stored parameter which is set by user input. The user typically determines an appropriate internal on the basis of the mean time between failure of the isolation devices 22, 23, 26.

The test procedure will now be described with reference to the first isolation device 22.

A characteristic of semiconductor isolation devices typically used in this context is that they exhibit a low resistance in a forward direction provided that a forward bias voltage $V_B$ exists between the input and output of the isolating device, so that during normal conduction the actual forward voltage $V_F$ across the device remains substantially equal to $V_B$ for all positive values of current. (In practice, there is a measurable variation in forward voltage as a function of current but this variation is small and not significant in relation to the operation of the embodiment.) Conduction in the forward direction ceases when the difference between the input and output voltage is less than the required forward bias voltage $V_B$ and conduction in the reverse direction is prevented at all times under normal operating conditions. $V_B$ is therefore a measurable device characteristic which will depend upon the intrinsic semiconductor properties of the isolation device and its form of construction and will generally have a predictable value until such time as the device becomes defective.

For a correctly operating first isolation device 22 therefore, $I_1 > 0$ if $V_F = V_B$ and $I_1 = 0$ if $V_F < V_B$ To place the first isolation device 22 under test in a first phase of testing constituting a short circuit test, the system control circuit 16 controls the N power supplies 12, 14, 15 such that the first power supply 12 outputs a supply voltage $V_{S1}$ which is marginally reduced below its normal level $V_S$ while marginally increasing the supply voltages $V_{S2}$ to $V_{SN}$ of the remaining power supplies of the system 10. The resulting voltage difference between $V_{S1}$ and $V_{S2}, \ldots V_{SN}$ is equal to a differential voltage $V_{S2} - V_{S1} = V_D$. The variation in power supply voltage is in this embodiment selected to be symmetrical such that supply voltage $V_{S1}$ decreases by $\frac{1}{2}V_D$ and supply voltages $V_{S2}$ to $V_{SN}$ increase by $\frac{1}{2}V_D$. In the absence of faults, the load 18 will now be supplied predominantly by those power supplies providing the highest voltage thereby increasing $V_L$. The resulting output of the fist isolation device 22 will increase marginally while the voltage at its input will decrease marginally since $V_{S1}$ is reduced. $V_D$ is selected to be sufficient to reduce the actual voltage $V_F$ across the first isolation device 22 to a level below it's characteristic value of bias voltage $V_B$. The expected result is that (assuming the isolation device 22 to be free of defects) the isolation device can no longer function as before to conduct in the forward direction and the current $I_1$ drawn through the sensing circuit 24 should fall to zero. If, however, a short circuit fault exists in the first isolation device 22, a negative value of current $I_1$ will be expected to flow (assuming positive sense in a direction towards the load 18) since the load voltage $V_L$ maintained by the remaining power supplies will (in the absence of defects in the remaining power supplies and isolation devices) exceed the reduced supply voltage $V_{S1}$ output by the first power supply 12.

The first phase of the test procedure therefore constitutes a short circuit test which comprises reducing supply voltage $V_{S1}$ and increasing supply voltages $V_{S2}$ to $V_{SN}$ to create the voltage differential $V_D$ and measuring the value of current $I_1$. If a negative value of $I_1$ is detected, a short circuit fault condition is determined to exist.

The test procedure for the first isolation device 22 then enters a second phase constituting an open circuit test in which the first power supply 12 is controlled to increase its supply voltage $V_{S1}$ to $V_S + \frac{1}{2}V_D$ while reducing the supply voltages $V_{S2}$ to $V_{SN}$ of the remaining power supplies to $V_S - \frac{1}{2}V_D$ so that the voltage differential $-V_D$ is created. The value of current $I_1$ is again detected using the first current sensing circuit 24. Here the value of $V_D$ is required to be sufficient for the forward voltage of each of the remaining isolation devices to be less than the characteristic bias voltage $V_B$ so that the expected result (in the absence of faults) is that in each case they cease to conduct. For example, the second isolation device 26 ceases to conduct because its actual forward voltage is less than $V_B$ and consequently $I_2$ falls to zero.

Under this second phase test condition, the load voltage $V_L$ is expected to be supplied entirely by the first power supply 12 with $I_1$ therefore being positive. If however the first isolation device 22 is open circuit, the remaining isolation devices 26, 23 will not turn off and the load will continue to be supplied by the remaining power supplies 14, 15 and current $I_1$ would be zero. Detection of $I_1$ being zero is therefore indicative of an open circuit fault in the first isolation device 22.

Detection of either of the above fault conditions triggers the system control circuit 16 to output an alarm signal to the alarm system 30.

The above test procedure is repeated to perform open circuit and short circuit tests for each power supply and associated isolation device in turn to complete a test cycle and the system control circuit 16 then awaits completion of a delay interval before beginning a next test cycle.

The amplitude of the differential voltage $V_D$ can be selected as follows:

during the first phase of the test procedure for the first isolation device 22, the actual voltage $V_F$ across the device is marginally reduced such that $V_F < V_B$ To guard against the possibility that the first power supply 12 is the only functioning supply, the differential voltage $V_D$ is limited to prevent a damaging reduction in load voltage $V_L$.

This requires:

$$V_S - \frac{1}{2}V_D - V_B \geq V_{min}$$

where $V_S$ is the normal (unmodified) power supply voltage, and where $V_{min}$ is a minimum value required to supply the load under conditions where all remaining supplies cease to supply the load 18 and assuming that the differential voltage is applied by reducing the output of the first power supply 12 by $\frac{1}{2}V_D$. The maximum value of $V_D$ is therefore given by $$V_D \leq 2(V_S - V_{min} - V_B)$$

The calculation of the preferred value of $V_D$ should also take account of resistive losses in the power supply bus 20 and statistical variation in the values of bias voltage $V_B$ for the isolation devices in the system, as well as taking account of other system tolerances such as deviation in power supply voltage from the nominal set value. Since these variables will be dependent on a given system, the optimum voltage differential may for example be determined empirically using a dummy load.

The differential voltage $V_D$ may alternatively be created by marginally varying the power supply voltage for the power supply of the selected isolation device while maintaining the supply voltages of the remaining power supplies constant. Alternatively, the remaining power supply voltages may be marginally varied while maintaining constant the supply voltage of the power supply of the selected isolation device.

Figure 2:
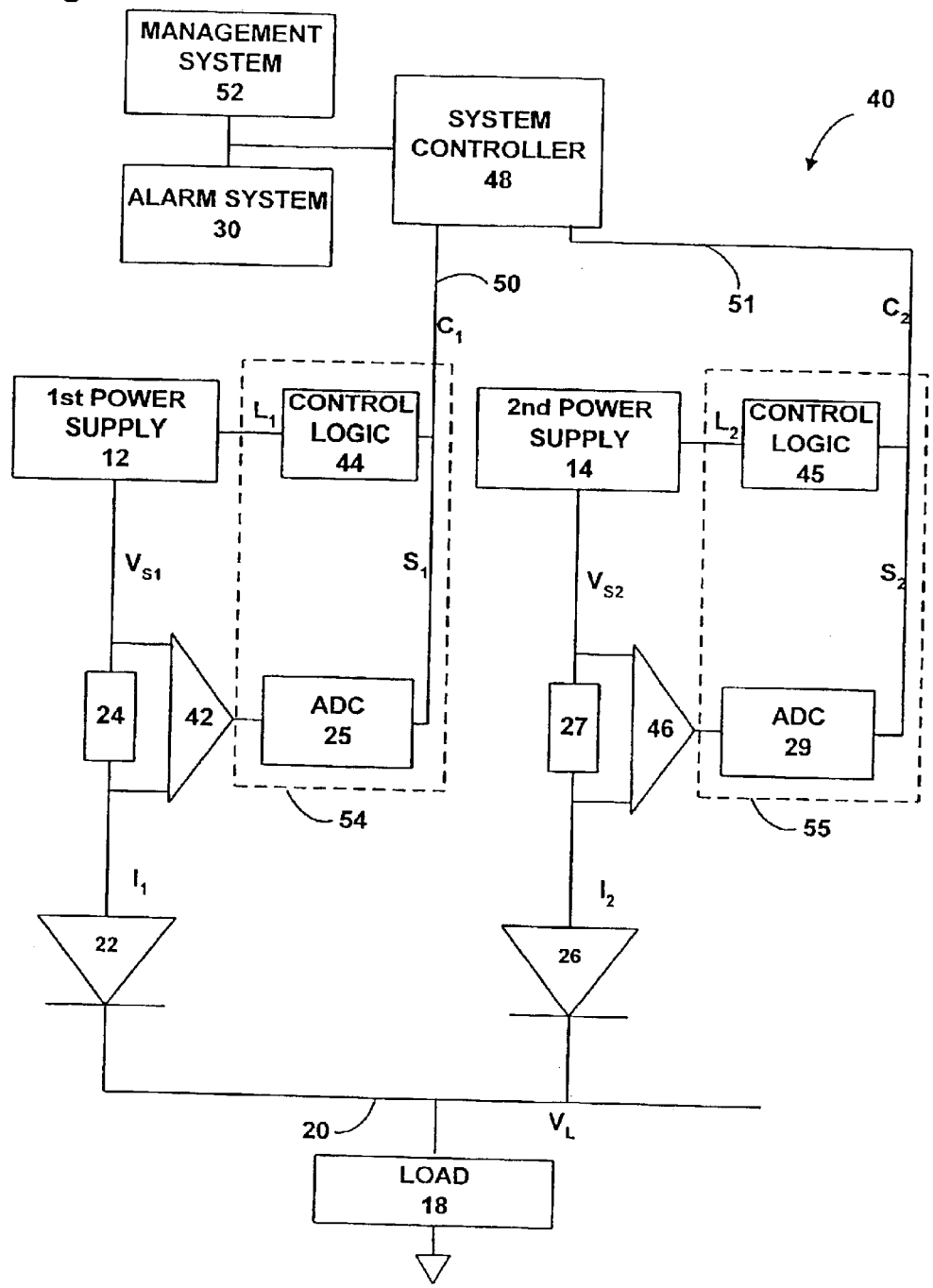
FIG. 2 is a schematic diagram of a further power supply system having two power supplies.

FIG. 2 illustrates a further power supply system 40 which will be described using corresponding reference numerals to those of FIG. 1 where appropriate for corresponding elements. The power supply system 40 comprises only two power supplies 12 and 14, provided with respective isolation devices 22 and 26, each of which comprises a respective single blocking diode.

The first isolating device 22 is provided with a first current sensor 24 in the form of a series connected resistor in combination with a differential amplifier 42 for measuring the voltage across the resistor and outputting an analogue value to an analogue to digital converter 25. Second current sensor 27 similarly comprises a resistor provided with a second differential amplifier 46 which provides an analogue signal to a second analogue to digital converter 29.

A control logic circuit 44 is connected to the first power supply 12 to provide a logic level signal L1 for margining up and down the outputs of the first power supply during each test cycle. The control logic circuit 44 and analogue to digital converter 25 are connected to the system controller 48 via a data bus 50 providing two way digital data communication. The databus 50 therefore carries to the system controller 48 the sensor signal S1 which represents the results of testing and also carries control commands $C_1$ from the system controller 48 to the control logic circuit 44 to initiate steps of each test cycle. The second power supply 14 is similarly provided with a second control logic circuit 45 for providing logic level signal L2 for margining the second power supply 14 and a databus S1 for carrying sensor signal S2 and commands $C_2$.

In the embodiment of FIG. 2, a single integrated circuit device provides control logic 44 and analogue to digital converter 25, the device being for example an ADM 1026 device produced by Analog Devices Inc, a pair of such devices 54 and 55 being provided for the respective power supplies 12 and 14 being represented in outline with broken lines in FIG. 2.

The first and second power supplies 12 and 14 in the embodiment of FIG. 2 are selected to each have a logic level input, generally referred to as a margin arm, enabling the nominal output voltage of the power supply to be switched up and down by marginal increments in response to the appropriate level of logic level signals $L_1$ and $L_2$. This facility is commonly provided in power supplies and used for example for checking voltage tolerance limits on equipment powered by the power supply. It is important that the value of $V_L$ should not fall below a predetermined minimum value $V_{min}$ so that the load 18 is capable of continuing normal operation if supplied with reduced $V_L$ corresponding to the marginally reduced voltage.

In use, the first and second power supplies 12 and 14 are operated with equal output voltages $V_S$ to provide an equal share of current to load 18. A test cycle is initiated by the system controller 48 at predetermined time intervals or in response to an external control signal from a management system 52. The control procedure for the first phase of the test cycle will now be described and comprises a short circuit test of the first isolation device 22 and an open circuit test of the second isolation device 26.

The system controller 48 outputs commands $C_1$ and $C_2$ via databus 50 and 51 to the control logic 44 and 45. In response to command $C_1$, the control logic 44 outputs logic level signal $L_1$ which margins down the output of first power supply 12 by $\frac{1}{2}V_D$. In response to command $C_2$, control logic 45 outputs logic level signal $L_2$ which margins up the output of second power supply 14 by $\frac{1}{2}V_D$. The characteristic bias voltage $V_B$ of the first isolation device 22 which in this example is a single diode is 0.6 volts and it is therefore sufficient for the test procedure for the differential voltage $V_D$ between the outputs of the power supplies to be such that the actual forward voltage $V_F$ across the first isolation device is reduced to a value of less than 0.6 volts. At this point, conduction through the first isolation device 22 should cease if it is functioning correctly and this can be detected by measuring the current $I_1$ using the first current sensor 24. If the system controller 48 detects from $S_1$ that the current $I_1$ is turned off in response to the margining of the power supplies 12 and 14, no short circuit fault is detected in the first isolation device 22. If, however, the current $I_1$ is a finite negative amount, this is indicative a short circuit fault condition existing in the first isolation device 22.

The current $I_2$ in the second isolation device 26 is at the same time measured and is expected to be positive since the second power supply 14 will continue to supply the load 18 when the first isolation device 22 turns off in the absence of a fault condition. If however the current $I_2$ is measured to be zero, this is indicative of an open circuit fault existing in the second isolation device 26. In this event, the first power supply 12 would continue supplying the load 18.

A second phase of the test procedure is then followed comprising an open circuit test of the first isolation device 22 and a short circuit test of the second isolation device 26. In this case the system controller 48 sends new commands $C_1$ and $C_2$ for selecting new logic level signals $L_1$ and $L_2$ to margin the second power supply 14 downwards such that $V_{S2}=V_S-\frac{1}{2}V_D$ and to margin the first power supply 12 upwards such that $V_{S1}=V_S+\frac{1}{2}V_D$. This is followed by the measurement of the currents $I_1$ and $D_2$.

During the second phase, detection of the zero value of $I_1$ is indicative of an open circuit fault in the first isolation device and detection of a negative value of $I_2$ is indicative of a short circuit fault in the second isolation device.

Figure 3:
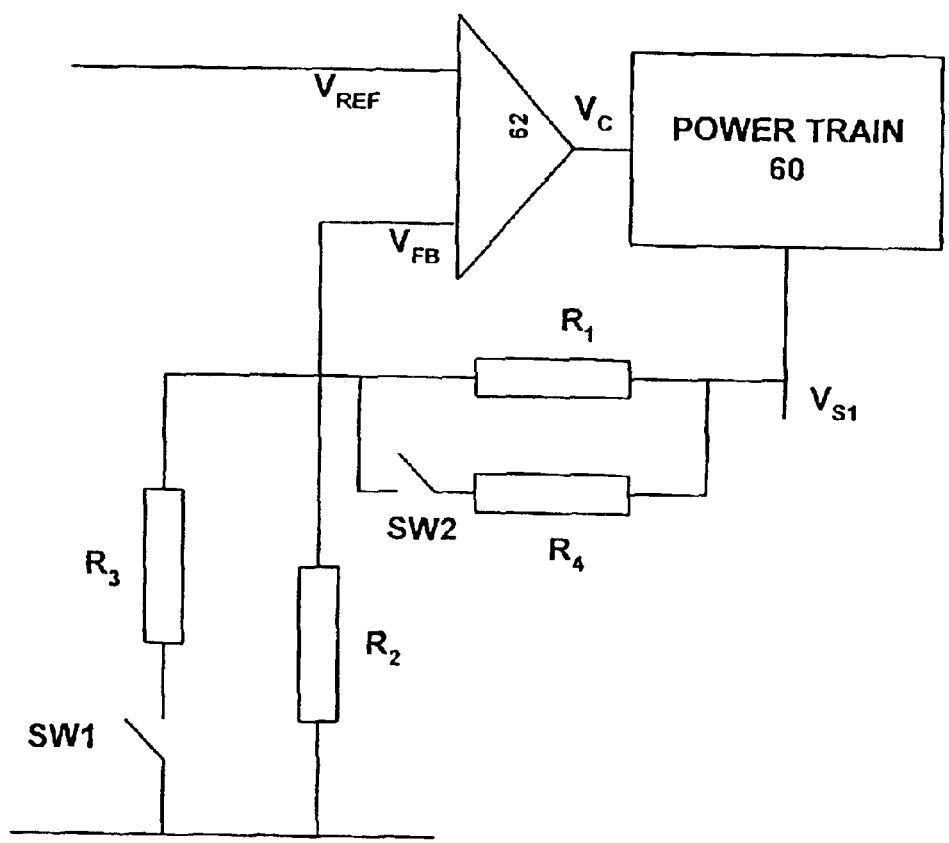
FIG. 3 is a schematic diagram showing detail of an output level control circuit of the system of FIG. 2.

FIG. 3 illustrates the manner in which a power supply which is controlled relative to a constant reference voltage $V_{REF}$ can be switched into a margin-up state or a margin-down state to vary the output voltage $V_{S1}$ during a test cycle. In FIG. 3, a power train 60 has an output voltage $V_{S1}$ controlled proportionally by a control voltage $V_C$ derived from the reference voltage $V_{ref}$ via a differential amplifier 62.

A potential divider circuit provided by resistances $R_1$ and $R_2$ provides a feedback input $V_{FB}$ to the differential amplifier 62 by dividing the supply voltage $V_{S1}$ in a predetermined manner. A switch SW1 is operable to connect a shunt resistance $R_3$ in parallel with resistance $R_2$ when it is required to upwardly bias $V_{FB}$ to increase the supply voltage $V_{S1}$ by a margin. Similarly, a switch SW2 is operable to connect a shunt resistance $R_4$ in parallel with $R_1$ when it is required to reduce the supply voltage $V_{S1}$ by a margin during the test cycle.

The power supply includes logic circuitry which is responsive to the signal $L_1$ shown in FIG. 2 to control setting of the switches SW1 and SW2 to produce the required margin.

The system of FIG. 2 is controlled by the system controller 48 to conduct a test cycle sequence as illustrated schematically in FIG. 4.

At 70, the system controller 48 initiates a test cycle and at 71 commences the first phase by controlling the first power supply 12 to marginally decrease voltage $V_{S1}$ by $\frac{1}{2}V_D$ and controlling the second power supply to marginally increase voltage $V_{S2}$ by $\frac{1}{2}V_D$.

Measured values of currents $I_1$ and $I_2$ are received as signals $S_1$ and $S_2$ by the system controller 48 which stores the values.

At 73, the system controller 48 controls the first and second power supplies 12 and 14 to restore their normal operating voltages to $V_S$.

At 74, the system controller 48 commences the second phase in which it controls the first power supply 12 to marginally increase $V_{S1}$ to $V_S+\frac{1}{2}V_D$ and controls the second power supply 14 to marginally decrease $V_{S2}$ to $V_S-\frac{1}{2}V_D$.

At 75, the system controller 48 receives measured values of the currents $I_1$ and $I_2$ as signals $S_1$ and $S_2$ for storage.

At 76, the system controller 48 controls the first and second power supplies 12 and 14 to restore their output voltage levels $V_{S1}$ and $V_{S2}$ to the normal level $V_S$.

At 77, the system controller 48 compares the stored logic level signals with values in a reference table and thereby determines at 78 whether or not a fault condition is determined to exists.

If a fault exists, an alarm is generated at 79.

At 80, the system controller 48 waits for a predetermined interval before recommencing the cycle.

The reference table against which measured results are compared corresponds to Table 1 below in which "short" and "open" represent short circuit and open circuit faults respectively.

TABLE 1

| $V_{S1}$ | $V_{S2}$ | $I_1$ | $I_2$ | 1ST ISOLATION DEVICE | 2ND ISOLATION DEVICE |
|---|---|---|---|---|---|
| DOWN | UP | <0 | | SHORT | |
| | | | 0 | | OPEN |
| UP | DOWN | 0 | | OPEN | |
| | | | <0 | | SHORT |

In each of the above embodiments, the alarm system 30 may comprise a connection to a service processor represented in FIG. 2 by management system 52 and which monitors the operating environment of the load 18 and which may also be responsible for initiating each test cycle by sending an initiating command to the system controller 48 over a network. The alarm signal transmitted to the service processor may be processed in a number of ways to alert an operator, for example by simply generating a warning message in a log file which is accessed by the operator or alternatively by causing a user interface to present a warning icon to the user.

The service processor may have responsibility for monitoring a number of load systems such as computers, either via a local network or over a distributed network such as the internet, and may be responsible for both initiating each test cycle and reporting the test results, thereby constituting the alarm system 30. In the case of each load 18 being a computer system, the mean time between failure of power supplies to such systems is such that the appropriate interval between each test cycle is typically of the order of one day.

In a typical example the load 18 is a computer system supplied by two power supplies in the configuration of FIG. 2, each power supply having a nominal output $V_S=48$ volts with a set point accuracy of ±2.4 volts and the isolation devices 22 and 26 are blocking diodes requiring a forward bias voltage in the range 0.4 to 1.0 volts. Allowing for power bus losses of the order of 1.0 volt and a noise margin of the order of 1.0 volt, the appropriate differential voltage $V_D$ is 7.4 volts, requiring the power supplies to be margined by ±½$V_D$=±3.7 volts (7.7% of $V_S$).

Embodiments of the present invention have application to power supply systems in which isolation devices are other than single diodes, for example, where a pair of FET devices is configured to provide one-way current conduction. As indicated above, for each variant of isolation device, the amount of margining applied to the power supplies must be selected appropriately to ensure that the actual voltage $V_F$ across the isolation device during a test cycle is decreased to a value less than the required forward bias voltage $V_B$ applicable to the particular isolation device under test. If the set of power supplies includes dissimilar types of isolation device, it may be appropriate to margin by different values of $V_D$ for the different power supplies or to assume a single value of $V_B$ corresponding to the maximum $V_B$ for the system when calculating $V_D$. In order to meet the eventuality that the power supply and isolation device which are currently subject to a test procedure are in fact the only source currently supplying the load, it is important that the reduced voltage delivered to the load as a result of the test procedure is maintained at a level which is sufficient for the load to continue to function normally.

The system of FIG. 2 may alternatively be configured to margin only one of the power supplies during a test cycle, the first phase comprising decreasing $V_{S1}$ to $V_S-V_D$ and the second phase comprising increasing $V_{S1}$ to $V_S+V_D$ while $V_{S1}=V_S$.

The function of the system controller 48 may be implemented in hardware or software, the software implementation requiring a processor provided with a computer program defining instructions for controlling operation of the processor. Similarly, the system control circuit 16 of FIG. 1 may be implemented in hardware or software. In each case, when implemented in software, the computer program may be supplied as instructions stored on a portable storage medium represented by medium 31 in FIG. 1 or may be communicated as a signal 32 over a communications system 33 such as the Internet.

What is claimed is:

1. A method of testing for latent faults in a redundant DC power supply system having at least two power supplies connected to a common load via respective isolation devices, each isolation device requiring a forward voltage to be equal to a respective forward bias voltage value to be operable in a normal conductive state, the method performed by a testing system comprising:

selecting as a subject for a test procedure, one isolation device and its corresponding power supply;

controlling the power supplies during the test procedure to marginally vary the output voltage of at least one power supply such that a differential voltage is applied between the output of the selected power supply and the outputs of the remaining power supplies for selectively changing the conductive state of at least one isolation device to a non conductive state by reducing its forward voltage to less than its respective forward bias voltage value;

measuring current through the selected isolation device; and determining whether the measured current is consistent with the existence of a fault condition in the selected isolation device.

2. A method as claimed in claim 1 wherein the test procedure includes a short circuit detection test in which each of the power supplies other than the selected power supply has a first output voltage greater than a second output voltage of the selected power supply such that the differential voltage is applied for changing the conductive state of the selected isolation device to a non-conductive state in the absence of a fault condition and wherein, if the measured current is non zero and in a direction towards the power supply, the measured current is determined to be consistent with a short circuit fault condition in the selected isolation device.

3. A method as claimed in claim 1 wherein the test procedure includes an open circuit detection test in which the selected power supply has a first output voltage greater than a second output voltage of the remaining power supplies such that the differential voltage is applied for changing the conductive state of each isolation device other than the selected isolation device to a non-conductive state in the absence of a fault condition and wherein, if the measured current is substantially zero, the measured current is determined to be consistent with an open circuit fault condition in the selected isolation device.

4. A method as claimed in claim 3 when dependent from claim 2 wherein the method comprises performing a test cycle comprising a sequence of test procedures such that in a completed test cycle respective short circuit tests and open circuit tests are performed for each of the isolation devices.

5. A method as claimed in claim 4 wherein the number of power supplies is two, the method comprising a first phase in which first and second power supplies output first and second voltages respectively with the first voltage being greater than the second voltage to apply the differential voltage, the currents in corresponding first and second isolation devices being measured to perform the open circuit test on the first isolation device and the short circuit test on the second isolation device; and a second phase in which the first and second power supplies output the second and first voltages respectively to reverse the applied differential voltage, currents in the first and second isolation devices being measured to perform the short circuit test in the first isolation device and the open circuit test in the second isolation device.

6. A method as claimed in claim 1 comprising operating a system controller to output command signals for controlling the power supplies;

each isolation device having a respective sensing circuit transmitting signals representative of the measurement of current to the system controller; and further comprising operating the system controller to determine whether the measured currents are consistent with the existence of a fault condition.

7. A method as claimed in claim 6 wherein the system controller initiates the test cycle at predetermined intervals.

8. A method as claimed in claim 7 including the system controller receiving and storing input data representative of the predetermined intervals and initiating the test cycle at intervals determined by the data.

9. A method as claimed in claim 6 comprising the system controller generating an alarm signal in response to detection of a fault condition.

10. A method as claimed in claim 1 wherein each power supply comprises a respective margin arm input and wherein the controlling step comprises inputting a respective logic level signal to the margin arm input of the each power supply.

11. A method as claimed in claim 1 wherein each isolation device comprises a respective diode.

12. A method as claimed in claim 1 wherein the differential voltage is applied such that, during the test procedure and in the absence of fault conditions, the load is supplied by at least one of the power supplies operating at a first output voltage and having a respective isolation device operating in a normal conductive state, and such that each remaining power supply operates at a second output voltage less than the first output voltage by the differential amount and in respect of which power supply the resulting forward voltage across its respective isolation device is less than the forward bias voltage level of the isolation device so that conduction is inhibited.

13. A method as claimed in claim 12 wherein the differential voltage is applied such that, during the test procedure and in the presence of a fault condition requiring the load to be supplied by one or more of the remaining power supplies operating at the second voltage, the resulting load voltage is greater than a minimum operational limit required for operation of the load.

14. A testing system for testing for latent faults in a redundant DC power supply system having at least two power supplies connected to a common load via respective isolation devices, each isolation device requiring a forward voltage to be equal to a respective forward bias voltage value to be operable in a normal conductive state, the testing system comprising: a system controller for selecting as a subject for a test procedure, one isolation device and its corresponding power supply;

control circuitry for controlling the power supplies during the test procedure to marginally vary the output voltage of at least one power supply such that a differential voltage is applied between the output of the selected power supply and the outputs of the remaining power supplies for selectively changing the conductive state of at least one isolation device to a non conductive state by reducing its forward voltage to less than its respective forward bias voltage value;

measuring circuitry for measuring current through the selected isolation device; and wherein the system controller is operable to determine whether the measured current is consistent with the existence of a fault condition in the selected isolation device.

15. A testing system as claimed in claim 14 wherein the test procedure includes an open circuit detection test in which the control circuitry is operable to control the selected power supply to have a first output voltage greater than a second output voltage of the remaining power supplies such that the differential voltage is applied for changing the conductive state of each isolation device other than the selected isolation device to a non-conductive state in the absence of a fault condition and wherein, if the measured current is substantially zero, the system controller is operable to determine the measured current to be consistent with an open circuit fault condition in the selected isolation device.

16. A testing system as claimed in claim 14 wherein the test procedure includes a short circuit detection test in which the control circuitry is operable to control each of the power supplies other than the selected power supply to have a first output voltage greater than a second output voltage of the selected power supply such that the differential voltage is applied for changing the conductive state of the selected isolation device to a non-conductive state in the absence of a fault condition and wherein, if the measured current is non zero and in a direction towards the power supply, the system controller is operable to determine the measured current to be consistent with a short circuit fault condition in the selected isolation device.

17. A testing system as claimed in claim 16 wherein the test procedure includes an open circuit detection test in which the control circuitry is operable to control the selected power supply to have a first output voltage greater than a second output voltage of the remaining power supplies such that the differential voltage is applied for changing the conductive state of each isolation device other than the selected isolation device to a non-conductive state in the absence of a fault condition and wherein, if the measured current is substantially zero, the system controller is operable to determine the measured current to be consistent with an open circuit fault condition in the selected isolation device.

18. A testing system as claimed in claim 17 wherein the testing system is operable to perform a test cycle comprising a sequence of test procedures such that in a completed test cycle respective short circuit tests and open circuit tests are performed for each of the isolation devices.

19. A testing system as claimed in claim 18 wherein the number of power supplies is two, the testing system being operable to perform a test cycle comprising a first phase in which first and second power supplies output first and second voltages respectively with the first voltage being greater than the second voltage to apply the differential voltage, the measuring circuitry being operable to measure the currents in corresponding first and second isolation devices to perform the open circuit test on the first isolation device and the short circuit test on the second isolation device; and a second phase in which the first and second power supplies output the second and first voltages respectively to reverse the applied differential voltage, the measuring circuitry being operable to measure the currents in the first and second isolation devices to perform the short circuit test in the first isolation device and the open circuit test in the second isolation device.

20. A testing system as claimed in claim 14 wherein the system controller is operable to output command signals for controlling the power supplies;
 each isolation device having a respective sensing circuit for transmitting signals representative of the measurement of current to the system controller; and
 the system controller being further operable to determine whether the measured currents are consistent with the existence of a fault condition.

21. A testing system as claimed in claim 20 wherein the system controller is operable to initiate the test cycle at predetermined intervals.

22. A testing system as claimed in claim 21 wherein the system controller is operable to receive and store input data representative of the predetermined intervals and being operable to initiate the test cycle at intervals determined by the data.

23. A testing system as claimed in claim 14 wherein the system controller is operable to generate an alarm signal in response to detection of a fault condition.

24. A testing system as claimed in claim 14 wherein each power supply comprises a respective margin arm input and wherein the control circuitry comprises control logic operable to input a respective logic level signal to the margin arm input of the each power supply.

25. A testing system as claimed in claim 24 and operable to apply differential voltage such that, during the test procedure and in the presence of a fault condition requiring the load to be supplied by one or more of the remaining power supplies operating at the second voltage, the resulting load voltage is greater than a minimum operational limit required for operation of the load.

26. A testing system as claimed in claim 14 and operable to apply the differential voltage such that, during the test procedure and in the absence of fault conditions, the load is supplied by at least one of the power supplies operating at a first output voltage and having a respective isolation device operating in a normal conductive state, and such that each remaining power supply operates at a second output voltage less than the first output voltage by the differential amount and in respect of which power supply the resulting forward voltage across its respective isolation device is less than the forward bias voltage level of the isolation device so that conduction is inhibited.

27. A system comprising:
 a load circuit;
 a plurality of DC power supplies each having a respective isolation device via which the power supply is connected to the load circuit, each isolation device requiring a forward voltage to be equal to a respective forward bias voltage value to be operable in a normal conductive state; and
 a test system for testing for latent faults, the test system comprising:
 a system controller for selecting as a subject for a test procedure, one isolation device and its corresponding power supply;
 control circuitry for controlling the power supplies to marginally vary the output voltage of at least one power supply such that a differential voltage is applied between the output of the selected power supply and the outputs of the remaining power supplies for selectively changing the conductive state of at least one isolation device to a non-conductive state by reducing its forward voltage to less than its respective forward bias voltage value;
 measuring circuitry for measuring current through the selected isolation device; and
 wherein the system controller is operable to determine whether the measured current is consistent with the existence of a fault condition in the selected isolation device.

28. A system as claimed in claim 27 wherein the load circuit comprises a computer system.

29. A system as claimed in claim 27 wherein each isolation device comprises a respective diode.

30. A portable storage medium carrying processor implementable instructions for instructing a processor to control a testing system to perform a method of testing for latent faults in a redundant DC power supply system having at least two power supplies connected to a common load via respective isolation devices, each isolation device requiring a forward voltage to be equal to a respective forward bias voltage value to be operable in a normal conductive state, the method performed by the testing system comprising:

selecting as a subject for a test procedure, one isolation device and its corresponding power supply;

controlling the power supplies during the test procedure to marginally vary the output voltage of at least one power supply such that a differential voltage is applied between the output of the selected power supply and the outputs of the remaining power supplies for selectively changing the conductive state of at least one isolation device to a non conductive state by reducing its forward voltage to less than its respective forward bias voltage value;

measuring current through the selected isolation device; and determining whether the measured current is consistent with the existence of a fault condition in the selected isolation device.

31. A signal carrying processor implementable instructions for instructing a processor to control a testing system to perform a method of testing for latent faults in a redundant DC power supply system having at least two power supplies connected to a common load via respective isolation devices, each isolation device requiring a forward voltage to be equal to a respective forward bias voltage value to be operable in a normal conductive state, the method performed by a testing system comprising;

selecting as a subject for a test procedure, one isolation device and its corresponding power supply;

controlling the power supplies during the test procedure to marginally vary the output voltage of at least one power supply such that a differential voltage is applied between the output of the selected power supply and the outputs of the remaining power supplies for selectively changing the conductive state of at least one isolation device to a non conductive state by reducing its forward voltage to less than its respective forward bias voltage value;

measuring current through the selected isolation device; and determining whether the measured current is consistent with the existence of a fault condition in the selected isolation device.

* * * * *